(12) United States Patent
Eom

(10) Patent No.: US 12,738,192 B2
(45) Date of Patent: Sep. 15, 2026

(54) IMAGE PROCESSING DEVICE AND IMAGE PROCESSING SYSTEM USING LOOK-UP TABLE WITH EXCLUSIVE OR OPERATION APPLIED

(71) Applicant: SAMSUNG ELECTRONICS CO., LTD., Suwon-si (KR)

(72) Inventor: Kiwoong Eom, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 120 days.

(21) Appl. No.: 18/786,208

(22) Filed: Jul. 26, 2024

(65) Prior Publication Data

US 2025/0148954 A1 May 8, 2025

(30) Foreign Application Priority Data

Nov. 6, 2023 (KR) ........................ 10-2023-0151719

(51) Int. Cl.
*G09G 3/20* (2006.01)
*G06F 1/03* (2006.01)
*H03K 19/21* (2006.01)

(52) U.S. Cl.
CPC ............ *G09G 3/2088* (2013.01); *G06F 1/03* (2013.01); *H03K 19/21* (2013.01)

(58) Field of Classification Search
None
See application file for complete search history.

(56) References Cited

U.S. PATENT DOCUMENTS 5,570,115 A 10/1996 Kawai et al.
8,466,935 B2 6/2013 Kai
8,713,081 B2 4/2014 Langhammer
8,760,941 B2 * 6/2014 Mishima ............. G06F 13/1678 365/189.15
10,192,282 B2 * 1/2019 Shiraishi ............... G06F 3/0611
11,012,094 B2 5/2021 Chow
2004/0189679 A1 9/2004 Ito et al.
2006/0119605 A1 6/2006 Lin et al.
2010/0153692 A1 * 6/2010 Kota ....................... G06T 11/20 712/222
2022/0019442 A1 * 1/2022 Yudanov ............... G06F 9/3887

FOREIGN PATENT DOCUMENTS

JP H07-050795 2/1995
JP 2014-192541 10/2014
KR 10-0434293 6/2004

* cited by examiner

*Primary Examiner* — Nurun Flora
(74) *Attorney, Agent, or Firm* — Fish & Richardson P.C.

(57) ABSTRACT

An example image processing device includes a first memory comprising a first look-up table, a second memory comprising a second look-up table, and a third memory comprising a third look-up table, a first processor and a second processor that are configured to output predetermined color values based on input color values using at least one of the first to third look-up tables, and a control logic circuit configured to control at least a portion of the first memory, the second memory, and the third memory. The control logic circuit is configured to, in response to receiving a read request for the first memory from each of the first and second processors, transmit data in the first look-up table to the first processor and to transmit data, obtained by performing an XOR operation on data in the third look-up table and data in the second look-up table, to the second processor.

20 Claims, 12 Drawing Sheets

【FIG. 1】
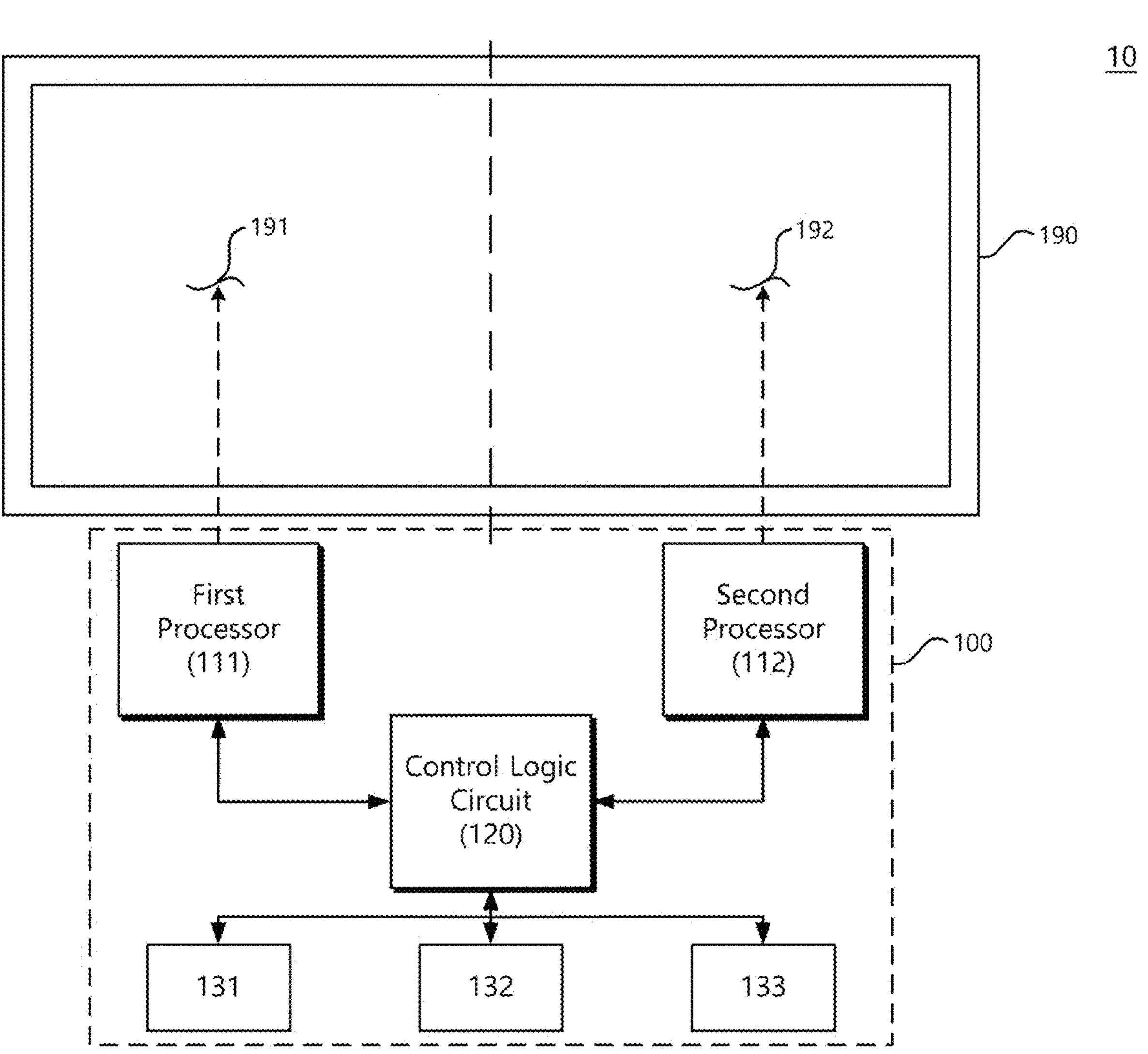

【FIG. 2】
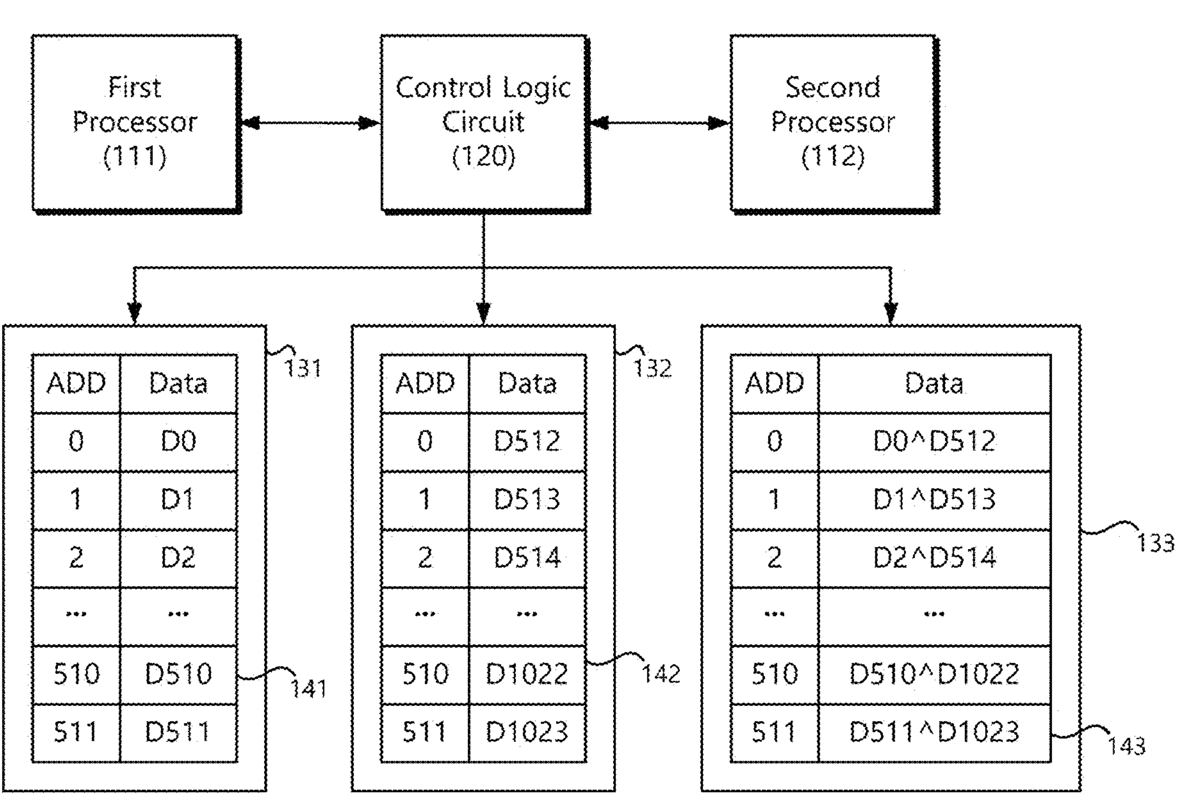

【FIG. 3a】
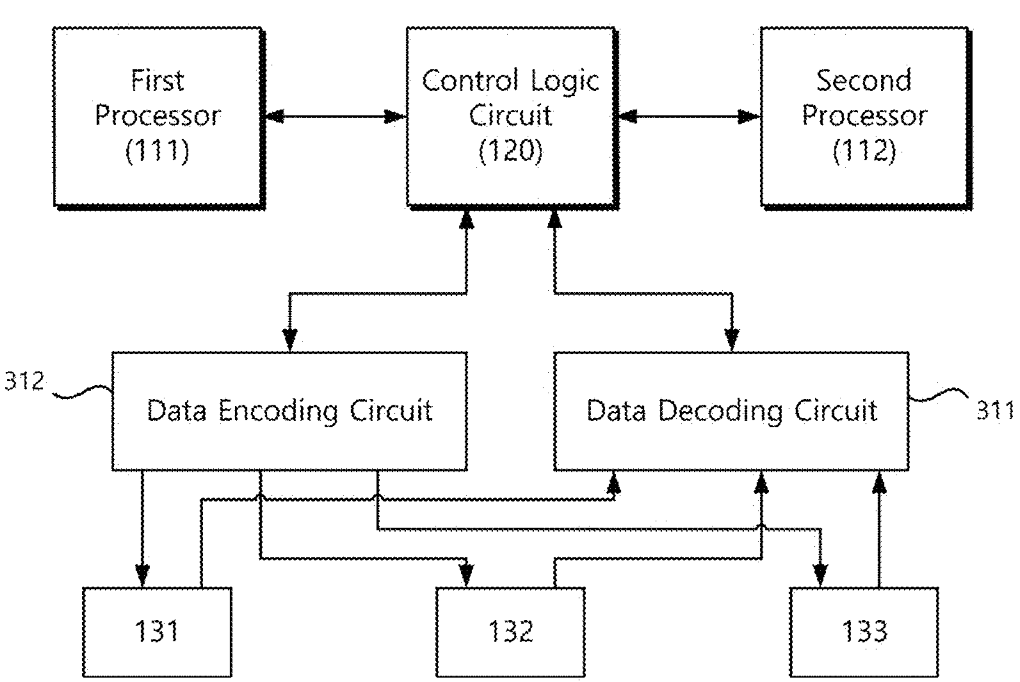

【FIG. 3b】
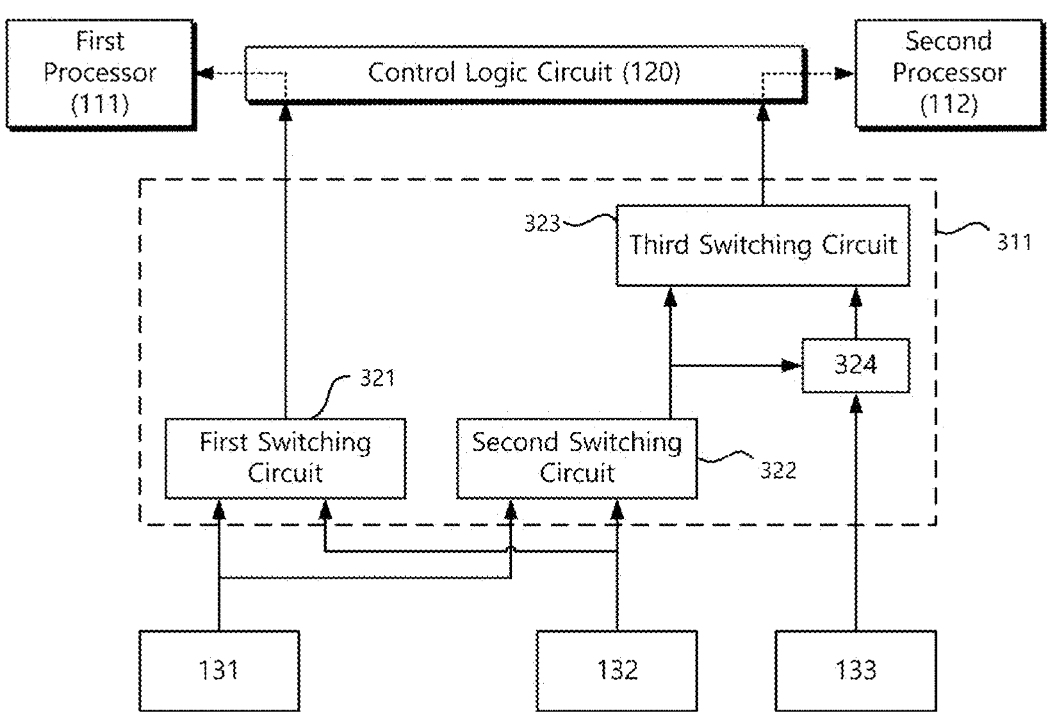

【FIG. 3c】
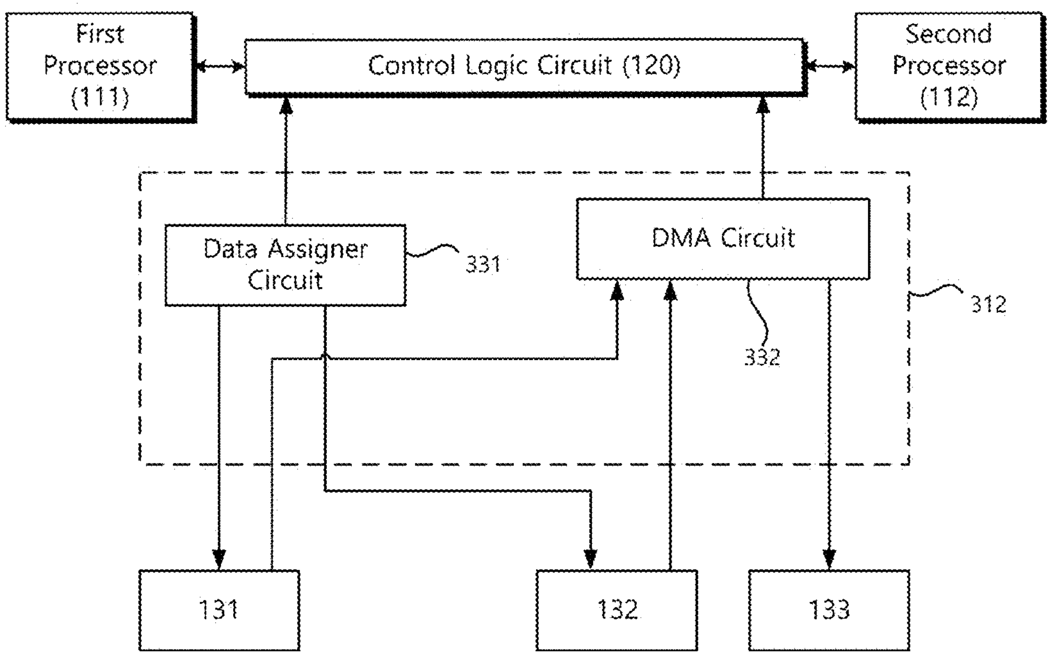

【FIG. 4】
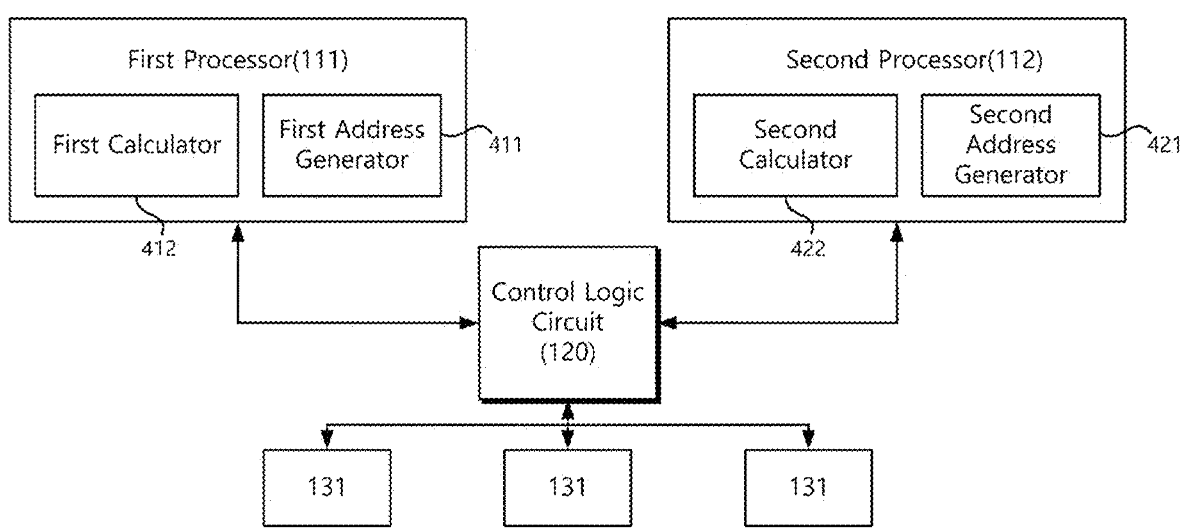

【FIG. 5】
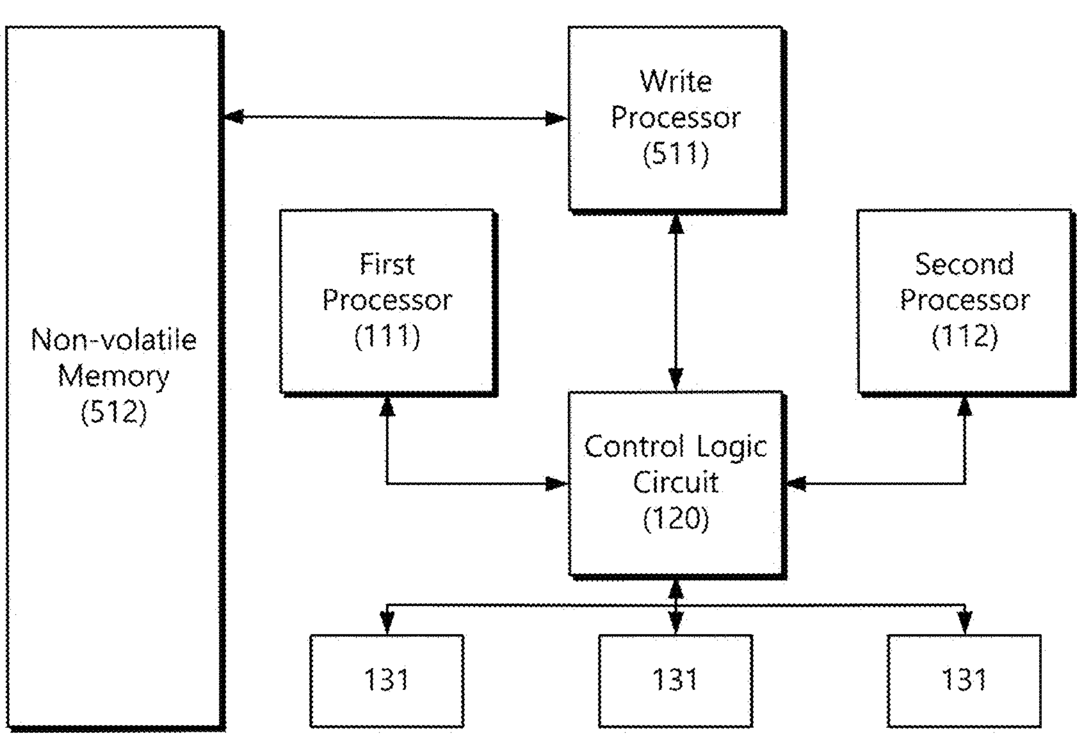

【FIG. 6】
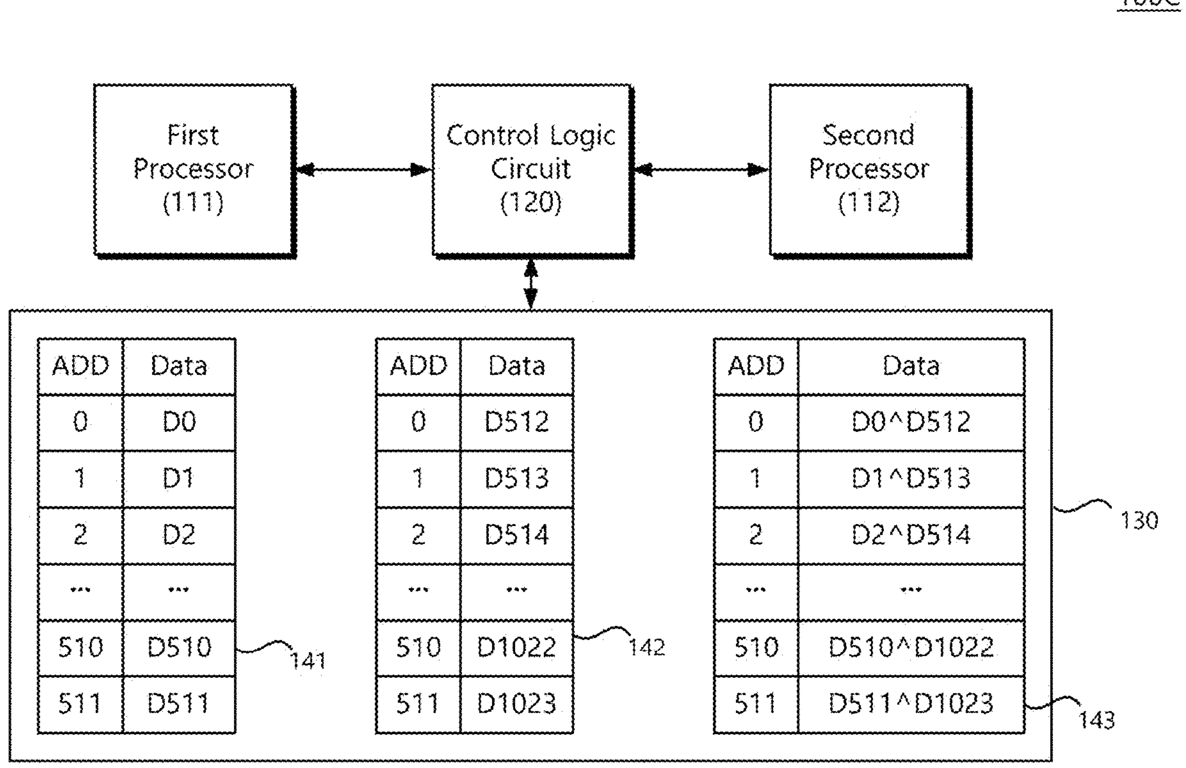

【FIG. 7】
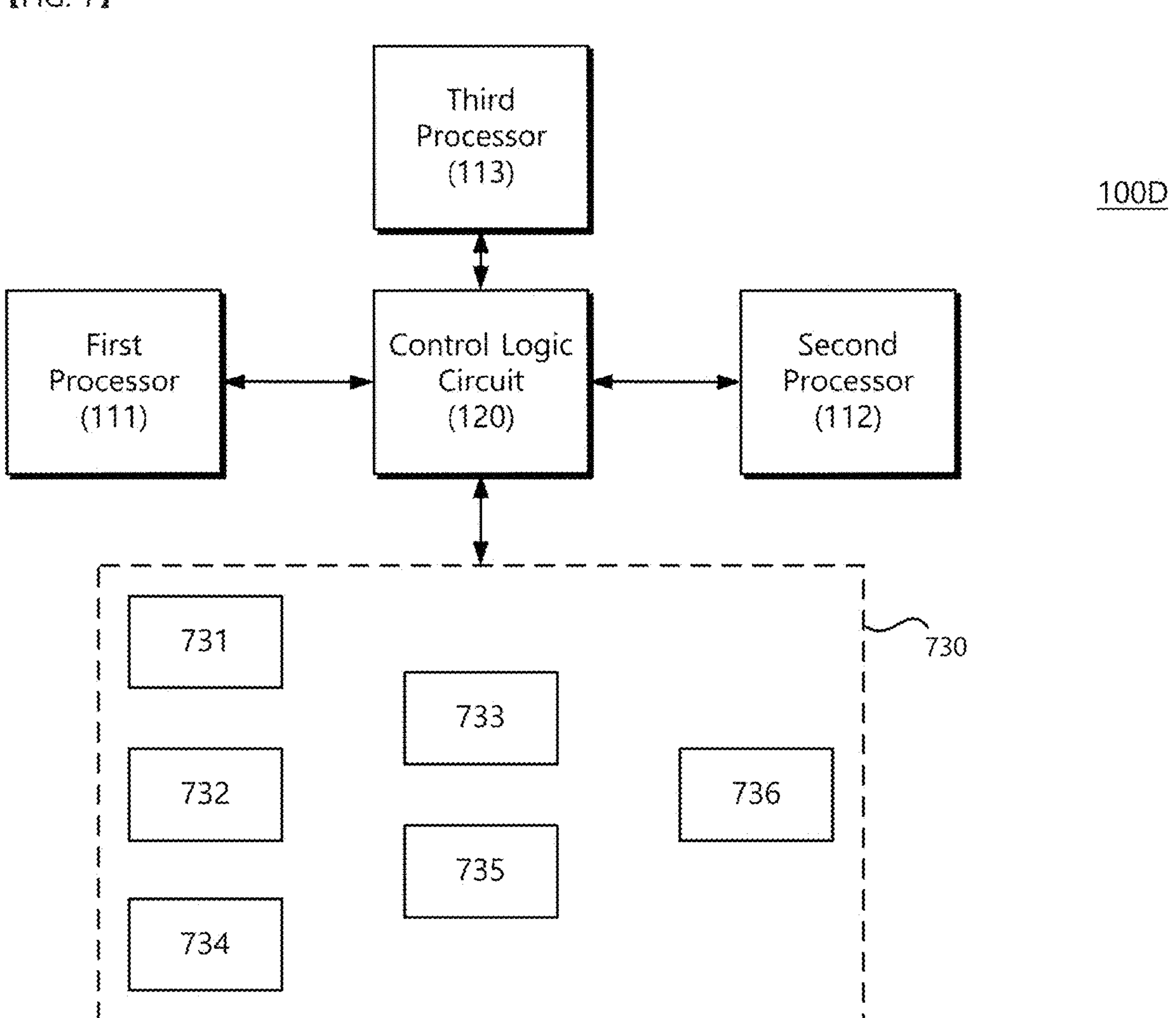

【FIG. 8】
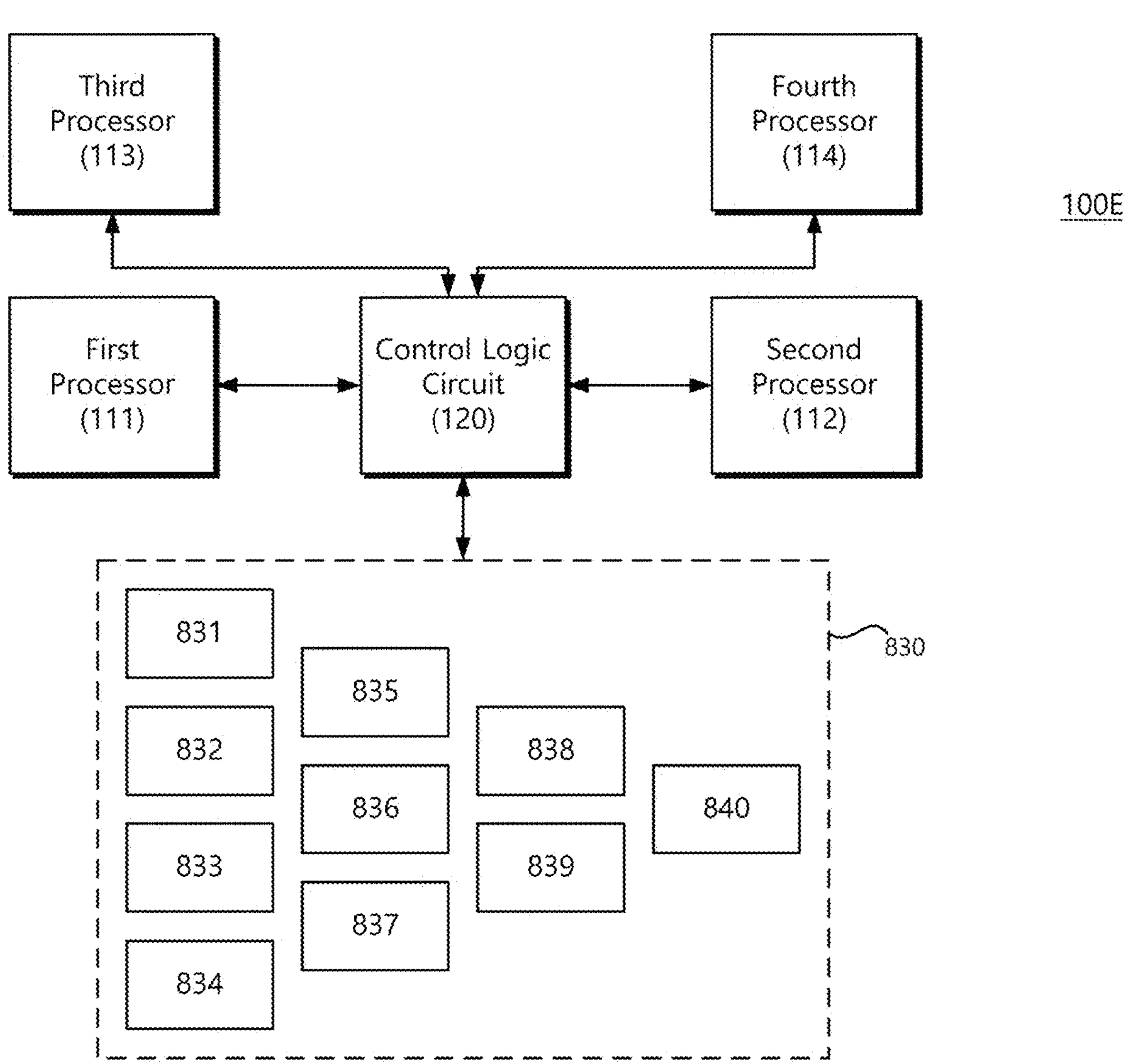

【FIG. 9】
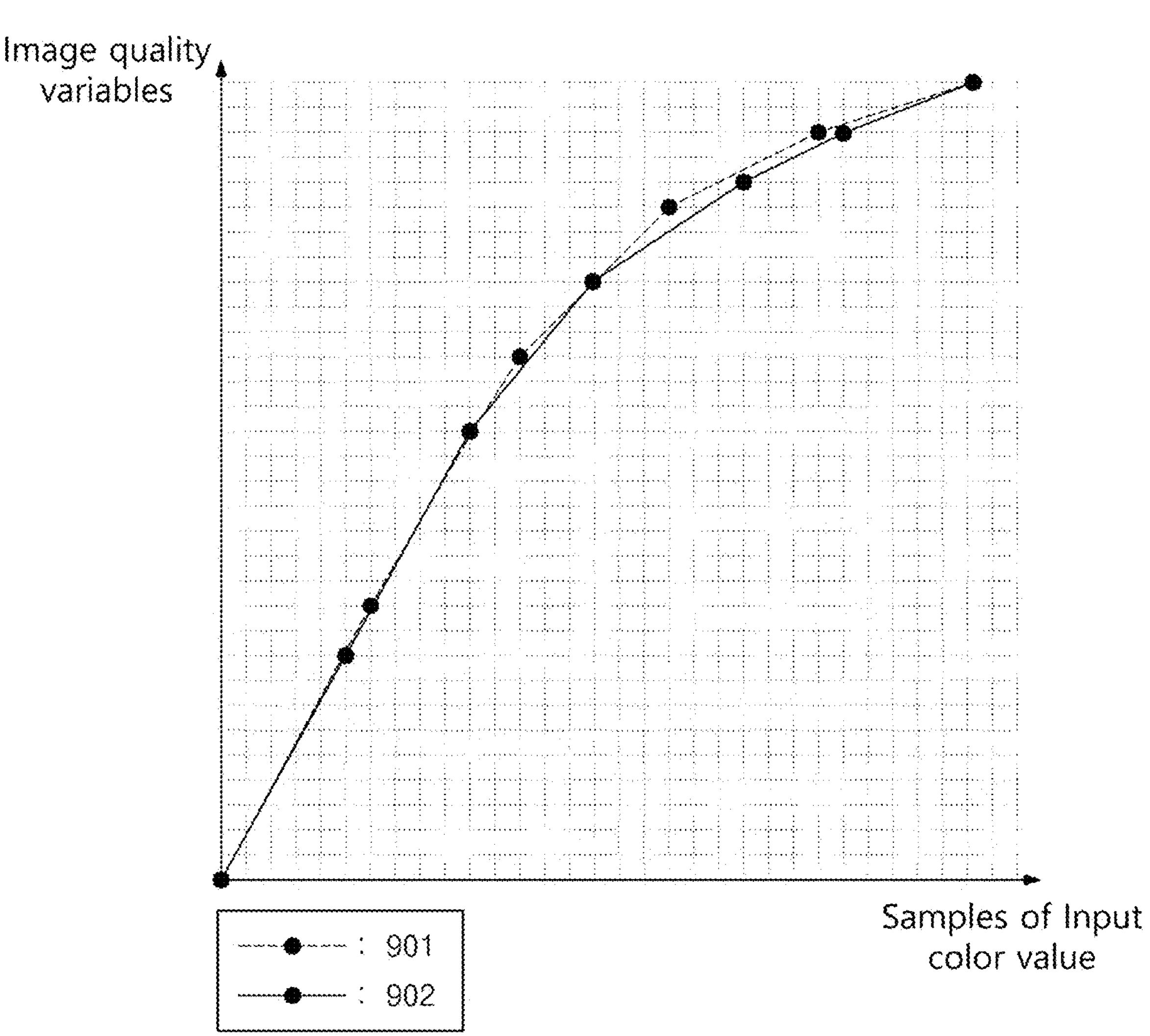

【FIG. 10】
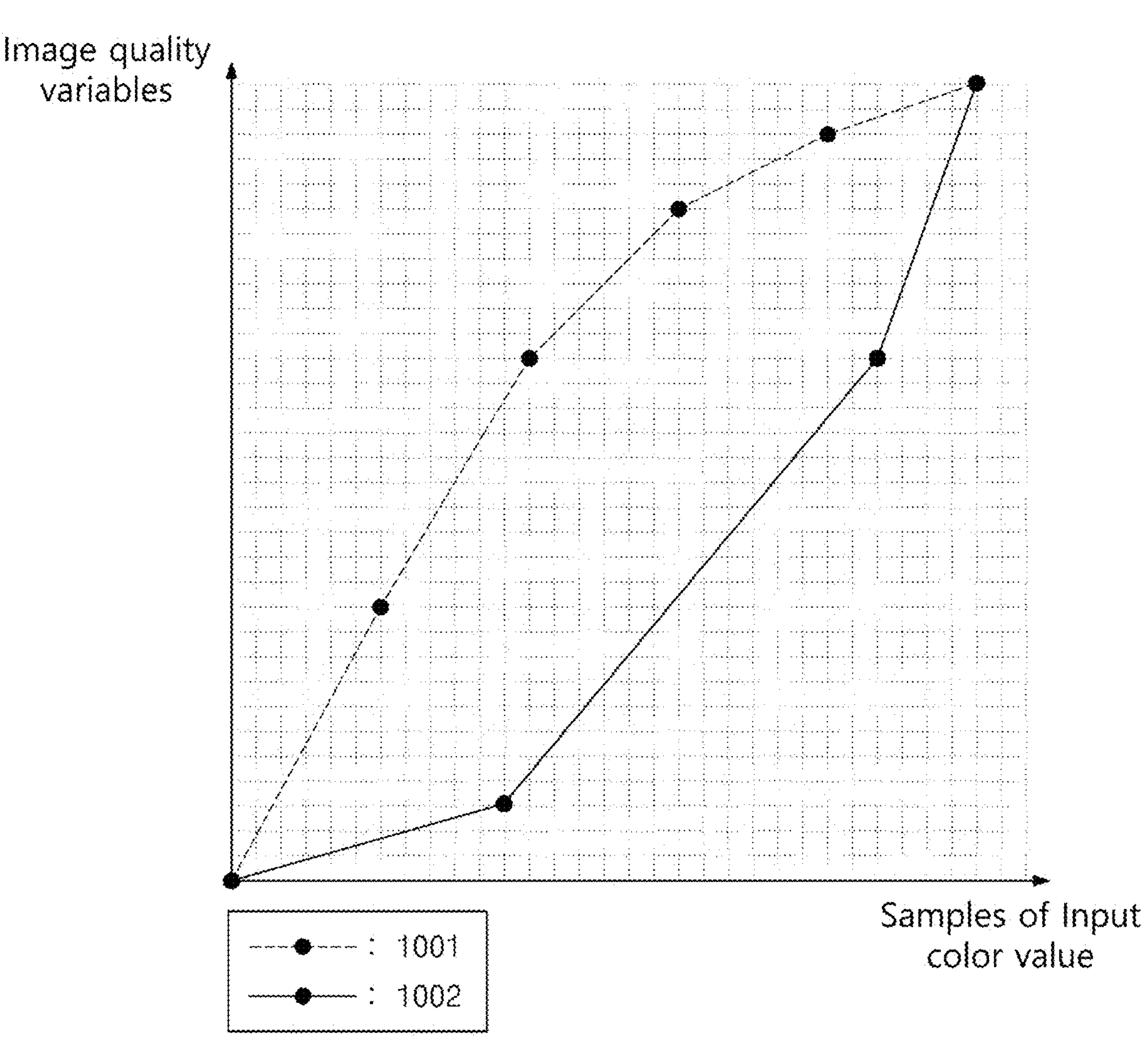

IMAGE PROCESSING DEVICE AND IMAGE PROCESSING SYSTEM USING LOOK-UP TABLE WITH EXCLUSIVE OR OPERATION APPLIED

CROSS-REFERENCE TO RELATED APPLICATION

This application claims priority under 35 USC § 119 to Korean Patent Application No. 10-2023-0151719, filed on Nov. 6, 2023, in the Korean Intellectual Property Office, the disclosure of which is herein incorporated by reference in its entirety.

BACKGROUND

Due to the development of electronic technology, various types of electronic devices are being developed and distributed. In particular, display devices used in various places such as homes, offices, and public places have been continuously developing in recent years.

Recently, the demand for high-resolution image services is significantly increasing. Such demand causes the resolution of display devices to be increasing. A plurality of image processors, color for each processor, and look-up tables for gamma mapping are required to process such high-resolution images.

However, when a plurality of image processors use corresponding look-up tables to compensate for differences in color gamuts and gamma characteristics, the look-up tables corresponding to the plurality of image processors have the same mapping values.

As described above, as a plurality of look-up tables having the same mapping values are present in duplicate, the size and power consumption of the image processing device may increase.

SUMMARY

The present disclosure relates to an image processing device correcting color values using a look-up table including data with an exclusive OR (XOR) operation applied.

In general, according to some aspects, an image processing device includes: a first memory including a first look-up table, a second memory including a second look-up table, and a third memory including a third look-up table, the third look-up table including data obtained by performing an exclusive OR (XOR) operation on corresponding pieces of data in the first look-up table and the second look-up table; a first processor and a second processor configured to output predetermined color values based on input color values using at least one of the first to third look-up tables; and a control logic circuit configured to control at least a portion of the first memory, the second memory, and the third memory. The control logic circuit may be configured to, in response to receiving a read request for the first memory from each of the first and second processors, transmit data in the first look-up table to the first processor and transmit data, obtained by performing an XOR operation on data in the third look-up table and data in the second look-up table, to the second processor.

In general, according to some aspects, an image processing device includes: a memory device including a first look-up table, a second look-up table, and a third look-up table, the third look-up table including a plurality of pieces of data obtained by performing an exclusive OR (XOR) operation on corresponding pieces of data in the first look-up table and the second look-up table; a first processor and a second processor configured to output predetermined color values based on input color values using at least a portion of the first to third look-up tables; and a control logic circuit configured to control the memory device. The control logic circuit may be configured to, in response to receiving a read request for the first look-up table from each of the first processor and the second processor, transmit data, stored in the first look-up table, to the first processor and transmit data, obtained by performing an XOR operation on data stored in the third look-up table and data stored in the second look-up table, to the second processor.

In general, according to some aspects, an image processing system includes: a display panel; a first memory including a first look-up table, a second memory including a second look-up table, and a third memory including a third look-up table; a first processor and a second processor configured to convert input color values into predetermined color values using at least one of the first to third look-up tables sored in the first to third memories; and a control logic circuit configured to control at least a portion of the first to third memories. The third look-up table may include data obtained by performing an exclusive OR (XOR) operation on corresponding pieces of data in the first look-up table and the second look-up table. The control logic circuit may be configured to, in response to receiving a read request for the first memory from each of the first and second processors, transmit data, stored in the first look-up table in the first memory, to the first processor and transmit data, obtained by performing an XOR operation on data stored in the third look-up table in the third memory and data stored in the second look-up table in the second look-up table, to the second processor. The first processor and the second processor may be configured to output the predetermined color values, generated based on data obtained through the control logic circuit, through different regions in the display panel.

BRIEF DESCRIPTION OF THE DRAWINGS

The above and other aspects, features, and advantages of the present disclosure will be more clearly understood from the following detailed description, taken in conjunction with the accompanying drawings.

FIG. 1 is a block diagram of an example of an image processing system.

FIG. 2 is a block diagram of an example of an image processing device.

FIG. 3A is a block diagram of an example of an image processing device including a data encoding circuit and a data decoding circuit.

FIG. 3B is a block diagram illustrating an example of a configuration of a data decoding circuit of FIG. 3A.

FIG. 3C is a block diagram illustrating an example of a configuration of the data encoding circuit of FIG. 3A.

FIG. 4 is a block diagram illustrating example configurations of the first processor and the second processor.

FIG. 5 is a block diagram of an example of an image processing device, further including a nonvolatile memory and a write processor.

FIG. 6 is a block diagram of an example of an image processing device.

FIG. 7 is a block diagram of an example of an image processing device, further including a third processor.

FIG. 8 is a block diagram of an example of an image processing device, including a third processor and a fourth processor.

FIG. 9 is a graph illustrating an example of a configuration in which performance of color correction for color values is improved as an image processing device utilizes a look-up table with an exclusive OR operation applied.

FIG. 10 is a graph illustrating an example of a configuration in which input color values are corrected to different image qualities as an image processing device utilizes a look-up table with an exclusive OR operation applied.

DETAILED DESCRIPTION

Hereinafter, example implementations will be described with reference to the accompanying drawings.

FIG. 1 is a block diagram of an example of an image processing system.

Referring to FIG. 1, an image processing system 10 may include a display panel 190 and an image processing device 100.

The image processing device 100 may include a first processor 111, a second processor 112, a first memory 131, a second memory 132, a third memory 133, and a control logic circuit 120.

In some implementations, the image processing system 10 may include a display panel 190 outputting an image including a plurality of color values. For example, the image processing system 10 may include a display panel 190 outputting an image including color values received from the image processing device 100.

The display panel 190 may output contents (for example, text, image, video, icon, symbol, or the like) based on data received from the image processing device 100.

For example, the display panel 190 may include a liquid crystal display (LCD), a light emitting diode (LED) display, an organic light emitting diode (OLED) display, a microelectromechanical systems (MEMS) display, or electronic paper display.

The above description of the configuration of the display panel 190 is only an example, and the configuration of the display panel 190 is not limited to the above-described examples.

In some implementations, the image processing device 100 may include a first memory 131, a second memory 132, and a third memory 133. For example, each of the first memory 131, the second memory 132, and the third memory 133 may be referred to a static random access memory (SRAM), but example implementations are not limited thereto.

For example, the image processing device 100 may include a first memory 131, a second memory 132, and a third memory 133, each including a look-up table.

The first memory 131 may include a first look-up table. The second memory 132 may include a second look-up table. The third memory 133 may include a third look-up table.

For example, the first look-up table, the second look-up table, and the third look-up table may have the same memory bits.

In addition, for example, each of the first look-up table, the second look-up table, and the third look-up table may have half the value of the memory bits required for the first processor 111 or the second processor 112 to convert input color values into color values supported by the display panel 190.

For example, when the first processor 111 requires 10240 bits to convert gamma characteristics of input data into the gamma characteristics supported by the display panel 190, each of the first look-up table, the second look-up table, and the third look-up table may have 5120 bits.

For example, when the second processor 112 requires 10240 bits to convert a color gamut of input data into a color gamut supported by the display panel 190, each of the first look-up table, the second look-up table, and the third look-up table may have 5120 bits.

However, the memory bits of the first look-up table, the second look-up table, and the third look-up table are not limited to the above-described examples.

In some implementations, the third look-up table may include data obtained by performing an exclusive OR (XOR) operation on corresponding pieces of data in the first look-up table and the second look-up table.

For example, the third look-up table may include data obtained by performing an exclusive OR (XOR) operation on data having address "0" in the first look-up table and data having address "0" in the second look-up table.

In some implementations, the image processing device 100 may include a first processor 111 and a second processor 112 outputting color values for at least a region of the display panel 190.

For example, the image processing device 100 may include a first processor 111 outputting a color value for a first region of the display panel 190. Also, the image processing device 100 may include a second processor 112 outputting a color value for a second region 192 of the display panel 190.

In some implementations, the image processing device 100 may include a first processor 111 and a second processor 112 outputting color values for distinguishable light-emitting elements, among light-emitting elements included in the display panel 190.

In some implementations, each of the first processor 111 and the second processor 112 may correct at least a portion of the input color values. For example, each of the first processor 111 and the second processor 112 may output color predetermined values supported by the display panel 190, depending on the input color values.

For example, each of the first processor 111 and the second processor 112 may convert data on the color gamut and/or gamma characteristics of input color values into color values output through the display panel 190, and may then output the converted color values.

In some implementations, the first and second processors 111 and 112 may correct the input color values using at least a portion of a look-up table stored in each of the first memory 131, the second memory 132, and the third memory 133.

For example, the first processor 111 and the second processor 112 may output predetermined color values based on the input color values using at least a portion of the look-up tables stored in each of the first memory 131, the second memory 132, and the third memory 133.

For example, the first processor 111 may correct a color gamut of input color values using the first look-up table stored in the first memory 131. In addition, the second processor 112 may correct gamma characteristics of the input color values using the second look-up table stored in the second memory 132.

In more detail, for example, the first processor 111 may convert the input RGB data into data in the form of LAB. Furthermore, the first processor 111 correct gamma characteristics of the data in the form of LAB using at least a portion of the first look-up table to the third look-up table, correct gamma characteristics of the data in the form of LAB using at least a portion of the first to third look-up tables, convert the corrected gamma characteristics into data in the form of RGB, and output the converted data in the form of RGB.

For example, the second processor 112 may convert input data in the form of RGB into data in the form of LAB. Furthermore, the second processor 112 may correct a color gamut of the data in the form of LAB using at least a portion of the first to third look-up tables, convert the corrected color gamut into data in the form of RGB, and output the converted data in the form of RGB.

In some implementations, the image processing device 100 may include a control logic circuit 120 controlling at least a portion of the first memory 131, the second memory 132, and the third memory 133.

In some implementations, the control logic circuit 120 controls at least a portion of the first memory 131, the second memory 132, and the third memory 133 based on requests received from the first processor 111 and the second processor 112.

In more detail, the control logic circuit 120 may write data in at least a portion of the first memory 131, the second memory 132, and the third memory 133, in response to receiving a write request from at least a portion of the first processor 111 and the second processor 112.

For example, the control logic circuit 120 may store data in the first look-up table of the first memory 131 in response to receiving a write request for the first memory 131 from the first processor 111. The control logic circuit 120 may also store data in the second look-up table of the second memory 132 in response to receiving a write request for the second memory 132 from the second processor 112.

Also, the control logic circuit 120 may store data in the third look-up table of the third memory 133 by performing an exclusive OR operation on a plurality of pieces of data having corresponding addresses in the first and second look-up tables.

Also, the control logic circuit 120 may output data stored in at least a portion of the first memory 131, the second memory 132, and the third memory 133 in response to receiving a read request from at least a portion of the first processor 111 and second processor 112.

For example, the control logic circuit 120 may output data, stored in the first look-up table of the first memory 131, to the first processor 111 in response to receiving a read request for the first memory 131 from the first processor 111. Also, the control logic circuit 120 may output data, stored in the second look-up table of the second memory 132, to the second processor 112 in response to receiving a read request for the second memory 132 from the second processor 112.

In some implementations, the control logic circuit 120 may transmit data in the first look-up table to the first processor 111 when the control logic circuit 120 receives a read request for the first memory 131 from the first processor 111 and the second processor 112.

In addition, when the control logic circuit 120 receives a read request for the first memory 131 from the first processor 111 and the second processor 112, the control logic circuit 120 may transmit data, obtained by performing an exclusive OR operation on the data stored in the second look-up table and the third look-up table, to the second processor 112.

In some implementations, when the control logic circuit 120 receives a read request for the second memory 132 from the first processor 111 and the second processor 112, the control logic circuit 120 may transmit the data, stored in the second look-up table 132, to the first processor 111.

In addition, when the control logic circuit 120 receives a read request for the second memory 132 from the first processor 111 and the second processor 112, the control logic circuit 120 may transmit data, obtained by performing an exclusive OR operation on the data stored in the first look-up table and the third look-up table 133, to the second processor 112.

For example, when the control logic circuit 120 receives a read request for the same memory from the first processor 111 and the second processor 112, the control logic circuit 120 may transmit data, stored in a look-up table of a requested memory, to the first processor 111.

In addition, when the control logic circuit 120 receives a read request for the same memory from the first processor 111 and the second processor 112, the control logic circuit 120 may transmit data, obtained by performing an exclusive OR operation on data of a look-up table of a memory other than a requested memory and data in the third look-up table, to the second processor 112.

In some implementations, when the control logic circuit 120 receives a read request for the first memory 131 from the first processor 111 and receives a read request for the second memory 132 from the second processor 112, the control logic circuit 120 may transmit data of the first memory 131 to the first processor 111. In addition, the control logic circuit 120 may transmit data of the second memory 132 to the second processor 112.

Referring to the above-described configurations, the image processing device 100 may control at least a portion of a plurality of processors to use a look-up table including data an exclusive OR operation applied. Thus, the image processing device 100 may control the plurality of processors to correct input color values by simultaneously using the same data.

Through the above-described configurations, the image processing device 100 may correct the input color value using a look-up table having a relatively small number of memory bits, compared to the case in which a look-up table and a memory including the same data are assigned to each of the plurality of processors.

As a result, the image processing system 10 may reduce sizes of the first memory 131, the second memory 132, and the third memory 133 in which look-up tables are stored. In addition, the image processing system 10 may reduce the power, consumed by the plurality of processors to correct color values, using the look-up table.

FIG. 2 is a block diagram of an example of an image processing device.

Referring to FIG. 2, an image processing device 100A may include a first processor 111, a second processor 112, a control logic circuit 120, a first memory 131, a second memory 132, and a third memory 133.

The image processing device 100A illustrated in FIG. 2 may be understood as a specific example of the image processing device 100 illustrated in FIG. 1. Therefore, the same or substantially the same elements have been represented by the same reference numerals, and redundant description will be omitted.

In some implementations, the image processing device 100A may include a first memory 131, a second memory 132, and a third memory 133. For example, each of the first memory 131, the second memory 132, and the third memory 133 may be referred to as a static random access memory (SRAM), but example implementations are not limited thereto.

In addition, each of the first memory 131, the second memory 132, and the third memory 133 may include a look-up table including a plurality of pieces of data, respectively assigned to a plurality of addresses.

For example, the first memory 131 may include a first look-up table 141. The second memory 132 may include a second look-up table 142. The third memory 133 may include a third look-up table 143.

Each of the first look-up table 141 and the second look-up table 142 may include at least a portion of data required for the first processor 111 or the second processor 112 to output a predetermined color value based on an input color value.

For example, the first look-up table 141 may include half of the data required for the first processor 111 or the second processor 112 to output a predetermined color value based on the input color value.

In addition, the second look-up table 142 may include half of the data required to output a predetermined color value based on an input color value of the first processor 111 or the second processor 112, except for the data stored in the first look-up table 141.

Accordingly, each of the first look-up table 141 and the second look-up table 142 may have half of memory bits (for example, 5120 bits) required to convert color values, input by the first processor 111 or the second processor 112, into predetermined color values supported by the display panel 190.

However, the type and size of the data stored in the first look-up table 141 and the second look-up table 142 are not limited to the above-described examples.

In some implementations, the third look-up table 143 may include data obtained by performing an exclusive OR (XOR) operation on a plurality of pieces of data assigned to corresponding addresses in the first look-up table 141 and the second look-up table 142.

For example, the third look-up table 143 may include data, obtained by performing an XOR operation on data D0 assigned to an address "0" in the first look-up table and data D512 assigned to an address "0" in the second look-up table 142, as data at address "0."

In addition, the third look-up table 143 may include data D511^D1023, obtained by performing an XOR operation on an address "511" in the first look-up table 141 and data D1023 assigned to an address "511" in the second look-up table 142, as data at address "0."

Accordingly, the third look-up table 143 may include the same memory bits (for example, 5120 bits) as the first look-up table 141 and the second look-up table 142. For example, the first look-up table 141, the second look-up table 142, and the third look-up table 143 may have the same memory bits.

Referring to the above-described configurations, the image processing device 100A may include a memory storing a look-up table having a relatively small number of memory bits, compared to the case in which a plurality of processors use different look-up tables including the same data, respectively.

This allows the image processing device 100A to significantly reduce the memory bit of the look-up table used by the processor to correct the input color value. Accordingly, the image processing device 100A may reduce a size of a memory storing a look-up table.

In some implementations, the image processing device 100A may include a control logic circuit 120 controlling at least a portion of the first memory 131, the second memory 132, and the third memory 133 in response to a request received from the first processor 111 and/or the second processor 112.

In some implementations, the control logic circuit 120 may transmit at least a portion of data in the first look-up table 141 to the first processor 111 when receiving a read request for the first memory 131 from the first processor 111 and the second processor 112.

In addition, the control logic circuit 120 may transmit data, obtained by performing an XOR operation on the data in the second look-up table 142 and data in the third look-up table 143, to the second processor 112 when receiving a read request for the first memory 131 from the first processor 111 and the second processor 112.

For example, when the control logic circuit 120 receives a read request for data at address "2" of the first memory 131 from the first processor 111 and a read request for data at address "510" of the first memory 131 from the second processor 112, the control logic circuit 120 may transmit data D2 at address "2" of the first look-up table 141 to the first processor 111.

In addition, the control logic circuit 120 may transmit data, obtained by performing an XOR operation on data D1022 at address "510" of the second look-up table 142 and data D1022^(D510^D1022) at address "510" of the third look-up table 143, to the second processor 112.

The data D1022^(D510^D1022), transmitted to the second processor 112, may be understood to be essentially the same as the data D510 at address "510" in the first look-up table 141.

In some implementations, the control logic circuit 120 may transmit the data in the second look-up table 142 to the first processor 111 when receiving a read request for the second memory 132 from the first processor 111 and the second processor 112.

In addition, the control logic circuit 120 may transmit data, obtained by performing an XOR operation on the data in the first look-up table 141 and data in the third look-up table 143, to the second processor 112 when receiving a read request for the second memory 132 from the first processor 111 and the second processor 112.

For example, the control logic circuit 120 may transmit data, stored in a look-up table of a requested memory, to the first processor 111 when receiving a read request for the same memory from the first processor 111 and the second processor 112. In addition, the control logic circuit 120 may transmit data, obtained by performing an XOR operation on data of a look-up table of a memory except for the request memory and data in the third look-up table 143, to the second processor 112.

In some implementations, the control logic circuit 120 may transmit data, stored in a look-up table of a memory requested by each processor, to each processor when receiving a read request for different memories from the first processor 111 and the second processor 112.

For example, the control logic circuit 120 may transmit data, stored in a look-up table of each memory requested by each processor, to each processor when receiving a read request for different memories from the first processor 111 and the second processor 112.

Referring to the above-described configurations, the image processing device 100A may control at least a portion of the plural processors to use a look-up table including data with an exclusive OR operation applied. Thus, the image processing device 100A may control the plurality of processors to correct input color values by simultaneously using the same data.

Through the above-described configurations, the image processing device 100A may correct the input color value using a look-up table having a relatively small number of memory bits, compared to the case in which a look-up table and a memory including the same data are assigned to each of the plurality of processors.

As a result, the image processing device 100A may reduce sizes of the first memory 131, the second memory 132, and the third memory 133 in which look-up tables are stored. In addition, the image processing device 100A may reduce the power, consumed by the plurality of processors to correct color values, using the look-up table.

FIG. 3A is a block diagram of an example of an image processing device including a data encoding circuit and a data decoding circuit. FIG. 3B is a block diagram illustrating an example of a configuration of a data decoding circuit of FIG. 3A, and FIG. 3C is a block diagram illustrating an example of a configuration of the data encoding circuit of FIG. 3A.

Referring to FIGS. 3A to 3C, an image processing device 100A may include a data decoding circuit 311 and a data encoding circuit 312 connected to the control logic circuit 120.

The image processing device 100A illustrated in FIGS. 3A to 3C may be understood as an example of the image processing device 100 of FIG. 1. Therefore, the same or substantially the same elements have been represented by the same reference numerals, and redundant description will be omitted.

In some implementations, the control logic circuit 120 311 may output data, stored in the first memory 131, the second memory 132, and the third memory 133, using the data decoding circuit 311.

For example, the control logic circuit 120 may control the data decoding circuit 311 to transmit at least a portion of the data, stored in the first memory 131, the second memory 132, and the third memory 133, to the first processor 111 or the second processor 112.

Referring to FIGS. 3A and 3B, the data decoding circuit 311 may include a first switching circuit 321, a second switching circuit 322, and a third switching circuit 323 connected to the control logic circuit 120. The data decoding circuit 311 may further include a logic operation circuit 324 performing an exclusive OR operation on data output from the third memory 133.

For example, the data decoding circuit 311 may include a first switching circuit 321 connected to the first memory 131 and the second memory 132. In addition, the data decoding circuit 311 may include a second switching circuit 322 connected to the first memory 131 and the second memory 132. In addition, the data decoding circuit 311 may include a third switching circuit 323 connected to the first memory 131 and the second memory 132 through the second switching circuit 322 and connected to the logic operation circuit 324.

In some implementations, the control logic circuit 120 may control the data decoding circuit 311 in response to receiving a read request from the first processor 111 and/or the second processor 112.

For example, the control logic circuit 120 may control a plurality of switching circuits 321, 322, and 323, included in the data decoding circuit 311, in response to receiving a read request from the first processor 111 and/or the second processor 112.

The control logic circuit 120 may control the first switching circuit 321 to transmit data, stored in the first memory 131 or the second memory 131, to the first processor 111 in response to receiving a read request from the first processor 111.

For example, the control logic circuit 120 may control the first switching circuit 321 to transmit at least a portion of data of a first look-up table to the first processor 111 when receiving a read request for the first memory 131 from the first processor 111.

In addition, the control logic circuit 120 may control the second switching circuit 322 to transmit data, output from the first memory 131 or the second memory 132, to the third switching circuit 323 in response to receiving a read request from the second processor 112.

In some implementations, the control logic circuit 120 may control the third switching circuit 323 to transmit data, obtained by performing an exclusive OR operation on data output from the second switching circuit 322 and data output from the third memory 133, to the second processor 112.

For example, the control logic circuit 120 may transmit data, output from the second memory 132, to the third switching circuit 323 through the second switching circuit 322 in response to receiving a read request for the first memory 131 from the first processor 111 and the second processor 112. Furthermore, the control logic circuit 120 may control the third switching circuit 323 to transmit data, obtained by performing an exclusive OR operation on data output through the second switching circuit 322 and data output from the third memory 133, to the second processor 112.

In some implementations, the control logic circuit 120 may control the third switching circuit 323 to transmit data, output from the second switching circuit 322, to the second processor 112.

For example, the control logic circuit 120 may transmit the data, output from the second memory 132, to the second processor 112 through the second switching circuit 322 and the third switching circuit 323 when receiving a read request for the first memory 131 from the first processor 111 and receiving a read request for the second memory 132 from the second processor 112.

Referring to the above-described configurations, the control logic circuit 120 may control switching circuits, included in the data decoding circuit 311, to transmit at least a portion of data stored in the first memory 131, the second memory 132, and the third memory 133, to the first processor 111 and/or second processor 112.

Through the above-described configurations, the image processing device 100A may control at least a portion of a plurality of processors to use a look-up table including data with an exclusive OR operation applied. This allows the image processing device 100A to control the plurality of processors to use the same data to correct input color values.

Accordingly, the image processing device 100A may correct the input color value using a look-up table having a relatively small number of memory bits, compared to the case in which a look-up table and a memory including the same data are assigned to each of the plurality of processors.

As a result, the image processing device 100A may reduce sizes of the first memory 131, the second memory 132, and the third memory 133 in which a look-up table is stored. Additionally, in some implementations, the control logic circuit 120 may store data in the first memory 131, the second memory 132, and the third memory 133 using the data encoding circuit 312.

Referring to FIGS. 3A and 3C, the data encoding circuit 312 may include a data assigner circuit 331 and a direct memory access (DMA) circuit 332.

For example, the data encoding circuit 312 may include a data assigner circuit 331 assigning data to an address of each memory in response to a write request.

In some implementations, the data assigner circuit 331 may store data in the first memory 131 and the second memory 132 in response to a write request received through the control logic circuit 120.

For example, the data assigner circuit 331 may assign and store the received data at a corresponding address in a first look-up table 141 or a second look-up table 142, based on address information included in a write request.

In some implementations, the data assigner circuit 331 may convert at least a portion of addresses of the address information, included in the received write request, into an address corresponding to the second look-up table 142.

For example, the data assigner circuit 331 may convert an address, which is outside an address range of the first look-up table 141 in the address information included in the received write request, into an address corresponding to the second look-up table 142.

For example, when the first look-up table 141 has an address range of "0" to "511," the data assigner circuit 331 may convert addresses "512" to "1023" included in the write request into addresses "0" to "511" in the second look-up table 142, respectively.

For example, when the first look-up table 141 has an address range of "0" to "511," the data assigner circuit 331 may convert address "513" into address "1" in the second look-up table 142 in response to receiving a write request for address "513."

Furthermore, the data assigner circuit 331 may assign and store the received data at an address corresponding to the converted address in the second look-up table 142.

For example, the data assigner circuit 331 may store the data "D513" at address "1" in the second look-up table 142 when receiving a write request for the data "D513" at address "513."

In addition, the data encoding circuit 312 may include a DMA circuit 332 performing an exclusive OR operation on data stored in the first memory 131 and data stored in the second memory 132 and stores a result of the exclusive OR operation in the third memory 133.

In some implementations, the DMA circuit 332 may obtain data stored in the first memory 131 and the data stored in the second memory 132 in response to data being stored in the first look-up table 141 and the second look-up table 142.

Also, the DMA circuit 332 may perform an exclusive OR operation on the data stored in the first memory 131 and the data stored in the second memory (132). To this end, the DMA circuit 332 may further include a logic operation circuit performing an exclusive OR operation on the data stored in the first memory 131 and the data stored in the second memory 132.

The DMA circuit 332 may perform an exclusive OR operation on a plurality of pieces of data stored at corresponding addresses in the first look-up table 141 and the second look-up table 142.

Further, the DMA circuit 332 may store the data, obtained as a result of the exclusive OR operation, in the third look-up table 143 of the third memory 133.

The DMA circuit 332 may assign and store data, obtained as a result of the exclusive OR operation, at an address corresponding to addresses of data in the first look-up table 141 and data in the second look-up table 142 used in the exclusive OR operation in the third look-up table 143.

For example, the DMA circuit 332 may assign and store data D0^D512, obtained by performing an exclusive OR operation on data "D0" stored at address "0" of the first look-up table 141 and data "D512" stored at address "0" of the second look-up table 142, at address "0" in the third look-up table 143.

Referring to the above-described configurations, the image processing device 100A may provide look-up tables having a half value (for example, 5120 bits) of memory bits (for example, 10240 bits) of the look-up table required for the respective processors 111 and 112 to correct an input color value (for example, 5120 bits).

For example, the image processing device 100A may include a memory storing a look-up table having a relatively small number of memory bits (for example, 5120 bits), compared to the case in which a plurality of processors use different look-up tables including the same data, respectively.

As a result, the image processing device 100A may significantly reduce memory bits of a look-up table used by a processor to correct an input color value. In addition, the image processing device 100A may reduce a size of a memory storing the look-up table.

FIG. 4 is a block diagram illustrating example configurations of a first processor and a second processor.

Referring to FIG. 4, an image processing device 100A may include a first processor 111 and a second processor 112, each including a calculator and an address generator.

The image processing device 100A illustrated in FIG. 4 may be understood as an example of the image processing device 100 in FIG. 1. Therefore, the same or substantially the same elements have been represented by the same reference numerals, and redundant description will be omitted.

In some implementations, the first processor 111 may include a first calculator 412 and a first address generator 411.

For example, the first processor 111 may include a first address generator 411 generating a read request including address information and transmitting the generated read request to a control logic circuit 120.

The first address generator 411 may generate a read request including at least a portion of data of an input color value, memory information, and address information of a look-up table.

For example, the memory information and the address information of the look-up table may be determined (or generated) based on data of the input color value.

In addition, the first processor 111 may include a first calculator 412 converting and outputting a color value, input to the image processing device 100A, using data transmitted from the control logic circuit 120.

For example, the first calculator 412 may output data, obtained by correcting at least a portion of color gamut and gamma characteristics, from a color value input to the image processing device 100A using data output by the control logic circuit 120 in response to a read request.

For example, the first calculator 412 may receive a coefficient for gamma characteristic from the control logic circuit 120 and output a value obtained by multiplying data on gamma characteristic of the color value input to the image processing device 100A by the received coefficient.

However, the configuration in which the first calculator 412 outputs the corrected color value is not limited to the above-described example.

In some implementations, the second processor 112 may include a second calculator 422 and a second address generator 421.

For example, the second processor 112 may include a second address generator 421 generating a read request including address information and transmitting the generated read request to the control logic circuit 120.

In some implementations, the second address generator 421 may generate a read request including at least a portion of the data of the input color value, memory information, and address information of a look-up table.

The memory information and the address information of the look-up table may be determined (or generated) based on data of the input color value.

In addition, the second processor 112 may include a second calculator 422 outputting a converted color value corresponding to the color value input to the image processing device 100A using the data transmitted from the control logic circuit 120.

For example, the second calculator 422 may output data, obtained by correcting at least a portion of color gamut and gamma characteristics, from a color value input to the image processing device 100A using data output by the control logic circuit 120 in response to a read request.

For example, the second calculator 422 may receive a coefficient for gamma characteristic from the control logic circuit 120 and output a value obtained by multiplying data on gamma characteristic of the color value input to the image processing device 100A by the received coefficient.

However, the configuration in which the second calculator 422 outputs the corrected color value is not limited to the above-described example.

Referring to the above-described configurations, each of the processors 111 and 112 of the image processing device 100A may obtain data, stored at an address specified through an address generator, in a look-up table stored in a memory to output a corrected color value. For example, the processors 111 and 112 of the image processing device 100A may access at least a portion of a plurality of memories to utilize the stored data.

As a result, the image processing device 100A may reduce a size of a memory storing data used to correct the color value.

FIG. 5 is a block diagram of an example of an image processing device, further including a nonvolatile memory and a write processor.

Referring to FIG. 5, an image processing device 100B may further include a write processor 511 and a nonvolatile memory 512.

The image processing device 100B illustrated in FIG. 5 may be understood as an example of the image processing device 100 in FIG. 1. Therefore, the same or substantially the same elements have been represented by the same reference numerals, and redundant description will be omitted.

In some implementations, the image processing device 100B may include a nonvolatile memory 512 storing data associated with predetermined color values depending on color values input to the image processing device 100B.

The nonvolatile memory 512 may include a memory cell array MCA. The memory cell array MCA may include a plurality of flash memory cells. For example, the plurality of flash memory cells may be NAND flash memory cells. However, example implementations are not limited thereto, and the plurality of flash memory cells may be cells of a memory such as a resistive RAM (ReRAM), a phase change RAM (PRAM), or a magnetic RAM (MRAM).

In some implementations, the nonvolatile memory 512 may store data on color values supported by a display panel 190 of the image processing device 100B in response to at least a portion of the color values input to the image processing device 100B.

For example, the nonvolatile memory 512 may store data on color gamut supported by the display panel 190 of the image processing device 100B in response to data associated with the color gamut of the color values input to the image processing device 100B.

In addition, the nonvolatile memory 512 may store data on gamma characteristics supported by the display panel 190 of the image processing device 100B in response to data associated with the gamma characteristics of the color values input to the image processing device 100B.

In some implementations, the nonvolatile memory 512 may store data on color values supported by the display panel 190 of the image processing device 100B in response to at least a portion of the color values input to the image processing device 100B according to a specific channel.

In addition, the image processing device 100B may further include a write processor 511 connected to the nonvolatile memory 512 and the control logic circuit 120.

In some implementations, the write processor 511 may control the control logic circuit 120 to store data, stored in the nonvolatile memory 512, in at least a portion of a first memory 131, a second memory 132, and a third memory 133.

For example, the write processor 511 may transmit a write request to the control logic circuit 120 to store data, stored in the nonvolatile memory 512, in at least a portion of the first memory 131, the second memory 132, and the third memory 133.

Referring to FIGS. 3C and 5, the write processor 511 may transmit a write request as a control signal such that the control logic circuit 120 controls the data encoding circuit 312, and may store the data, stored in the nonvolatile memory 512, in at least a portion of the first memory 131, the second memory 132, and the third memory 133.

For example, the write processor 511 may store the data, stored in the nonvolatile memory 512, in at least a portion of the first memory 131, the second memory 132, or the third memory 133 in response to the image processing device 100B being turned on. Also, the write processor 511 may store the data, stored in the non-volatile memory 512, in at least a portion of the first memory 131, the second memory 132, and the third memory 133 in response to power being applied to the image processing device 100B.

For example, the write processor 511 may store the data, stored in the nonvolatile memory 512, in at least a portion of the first memory 131, the second memory 132, and the third memory 133 in response to receiving a write input (for example, a channel switching input) from a user through an interface of the image processing device 100B.

However, the configuration in which the write processor 511 or the control logic circuit 120 stores the data, stored in the nonvolatile memory 512, in at least a portion of the first memory 131, the second memory 132, or the third memory 133 is not limited to the above-described examples.

Referring to the above-described configurations, the image processing device 100B may store data, stored in a nonvolatile memory, in a memory having a relatively small number of memory bits and a relatively small size.

As a result, the image processing device 100B may reduce power consumed to store data used to correct an input color value.

FIG. 6 is a block diagram of an example of an image processing device.

Referring to FIG. 6, an image processing device 100C may include a first processor 111, a second processor 112, a control logic circuit 120, and a memory device 130.

The image processing device 100C illustrated in FIG. 6 may be understood as an example of the image processing device 100 in FIG. 1. Therefore, the same or substantially the same elements have been represented by the same reference numerals, and redundant description will be omitted.

In some implementations, the image processing device 100C may include a memory device 130 including a plurality of look-up tables.

For example, the image processing device 100C may include a memory device 130 including a first look-up table 141, a second look-up table 142, and a third look-up table 143.

The memory device 130 may include a first look-up table 141, a second look-up table 142, and a third look-up table 143 stored in separate storage spaces in the memory device 130.

In some implementations, the control logic circuit 120 may control the memory device 130 in response to a request received from the first processor 111 and/or the second processor 112.

In some implementations, the control logic circuit 120 may transmit at least a portion of data in the first look-up table 141 to the first processor 111 when receiving a read request for the first look-up table 141 from the first processor 111 and the second processor 112.

In addition, the control logic circuit 120 may transmit data, obtained by performing an exclusive OR operation on the data in the second look-up table 142 and data in the third look-up table 143, to the second processor 112 when receiving a read request for the first look-up table 141 from the first processor 111 and the second processor 112.

For example, the control logic circuit 120 may transmit data D2 at address "2" of the first look-up table 141 to the first processor 111 when receiving a read request for the data at address "2" of the first look-up table 141 from the first processor 111 and a read request for data at address "510" of the first look-up table 141 from the second processor 112.

In addition, the control logic circuit 120 may transmit data D1022^(D510^D1022), obtained by performing an exclusive OR operation on the data D1022 at address "510" of the second look-up table 142 and data D510^D1022 at address "510" of the third look-up table 143, to the second processor 112.

The data D1022^(D510^D1022), transmitted to the second processor 112, may be understood to be substantially the same as the data D510 at address "510" of the first look-up table 141.

In some implementations, the control logic circuit 120 may transmit data in the second look-up table 142 to the first processor 111 when receiving a read request for the second look-up table 142 from the first processor 111 and the second processor 112.

Also, the control logic circuit 120 may transmit data, generated by performing an exclusive OR operation on the data in the first look-up table 141 and data in the third look-up table 143, to the second processor 112 when receiving a read request for the second look-up table 142 from the first processor 111 and the second processor 112.

For example, the control logic circuit 120 may transmit data, stored in the requested look-up table, to the first processor 111 when receiving a read request for the same look-up table from the first processor 111 and the second processor 112. Also, the control logic circuit 120 may transmit data, generated by performing an exclusive OR operation on data in the look-up table except for the requested look-up table and data in the third look-up table 143, to the second processor 112.

In some implementations, the control logic circuit 120 may transmit data in a look-up table, requested by each processor, to each processor when receiving a read request for different look-up tables from the first processor 111.

For example, the control logic circuit 120 may transmit data, stored in the look-up table requested by each processor, to each processor when receiving a read request for different look-up tables from the first processor 111 and the second processor 112.

Referring to the above-described configurations, the image processing device 100C may control at least a portion of a plurality of processors to use a look-up table including data with an exclusive OR operation applied. Thus, the image processing device 100C may allow the plurality of processors to utilize the same data.

Through the above-described configurations, the image processing device 100C may compensate for an input color value using a look-up table having a relatively small number of memory bits, compared to the case in which look-up tables including the same data are assigned to a plurality of processors, respectively.

Accordingly, the image processing device 100C may reduce a size of the memory device 130 in which the look-up table is stored. In addition, the image processing device 100C may reduce the amount of power consumed by the plurality of processors to compensate for color values using the look-up table.

FIG. 7 is a block diagram of an example of an image processing device, further including a third processor.

Referring to FIG. 7, an image processing device 100D may include a first processor 111, a second processor 112, a third processor 113, a control logic circuit 120, and a plurality of memories 730. The plurality of memories 730 may include a first memory 731 to a sixth memory 736.

The image processing device 100D illustrated in FIG. 7 may be understood as an example of the image processing device 100 of FIG. 1. Therefore, the same or substantially the same elements have been represented by the same reference numerals, and redundant description will be omitted.

In some implementations, the image processing device 100D may include a first memory 731 to a sixth memory 736, each connected to a control logic circuit 120. Each of the first memory 731 to the sixth memory 736 may store a look-up table including data required for a processor to correct input color values.

In some implementations, each of the first memory 731, the second memory 732, and the third memory 733 may store a look-up table that including data required for the first processor 111, the second processor 112, or the third processor 113 to correct an input color value.

The second memory 732 may include a second look-up table including a plurality of pieces of data, except for a plurality of pieces of data stored in the first memory 731 and the second memory 732, among a plurality of pieces of data required for the first processor 111, the second processor 112, or the third processor 113 to correct an input color value.

The third memory 733 may include a third look-up table including a plurality of pieces of data, except for a plurality of pieces of data stored in the first memory 731, among a plurality of pieces of data required for the first processor 111, the second processor 112, or the third processor 113 to correct an input color value.

Each of the first memory 731, the second memory 732, and the third memory 733 may store a look-up table having memory bits (for example, 3414 bits) corresponding to ⅓ of memory bits (for example, 10242 bits) required for each of the processors 111, 112, and 113 to correct input color values.

The fourth memory 734 may store a fourth look-up table including data obtained by performing an exclusive logical OR logic operation on the data in the first look-up table stored in first memory 731 and the data in the second look-up table stored in second memory 732.

The fifth memory 735 may store a fifth look-up table including data obtained by performing an exclusive logical OR logic operation on the data in the second look-up table stored in second memory 732 and the data in the third look-up table stored in third memory 733.

The sixth memory 736 may store a sixth look-up table including data obtained by performing an exclusive logical OR logic operation on the data in the first look-up table stored in first memory 731 and the data in the third look-up table stored in third memory 733.

In some implementations, the control logic circuit 120 may transmit the data in the first look-up table, stored in the first memory 731, to the first processor 111 when receiving a read request for the first memory 731 from the first processor 111 to the third processor 113.

Also, the control logic circuit 120 may transmit data, obtained by performing an exclusive logical OR logic operation on the data in the second look-up table stored in the second memory 732 and the data of the fourth look-up table stored in the fourth memory 734, to the second processor 112.

Also, the control logic circuit 120 may transmit data, obtained by performing an exclusive logical OR logic operation on the data in the third look-up table stored in the third memory 733 and the data of the sixth look-up table stored in the sixth memory 736, to the third processor 113.

In some implementations, the control logic circuit 120 may transmit the data in the first look-up table, stored in the first memory 731, to the first processor 111 when receiving a read request for the first memory 731 from the first processor 111 and the second processor 112 and receiving a read request for the third memory 733 from the third processor 113.

Also, the control logic circuit 120 may transmit data, obtained by performing an exclusive logical OR logic operation on the data in the second look-up table stored in the second memory 732 and the data of the fourth look-up table stored in the fourth memory 734, to the second processor 112.

Also, the control logic circuit 120 may transmit the data in the third look-up table, stored in the third memory 733, to the third processor 113.

In some implementations, the control logic circuit 120 may transmit data of a look-up table, stored in a memory for which a read request is received, to each processor when receiving read requests for different memories from the first processor 111, the second processor 112, and the third processor 113.

Referring to the above-mentioned configurations, the image processing device 100D may control at least a portion of a plurality of processors to use a look-up table including a plurality of pieces of data with an exclusive OR operation applied. Thus, the image processing device 100D may control the plurality of processors to simultaneously utilize the same data.

Through the above-described configurations, the image processing device 100D may correct an input color value using a look-up table having a relatively smaller number of memory bits, compared to the case in which a look-up table and a memory including the same data are assigned to the plurality of processors, respectively.

As a result, the image processing device 100D may reduce a size of each of the first memory 731 to the sixth memory 736 in which a look-up table is stored.

In addition, the image processing device 100D may reduce power, consumed by the plurality of processors, to correct color values using the look-up table.

FIG. 8 is a block diagram of an example of an image processing device, including a third processor and a fourth processor.

Referring to FIG. 8, an image processing device 100E may include a first processor 111, a second processor 112, a third processor 113, a fourth processor 114, and a control logic circuit 120, and a plurality of memories 830. The plurality of memories 830 may include a first memory 831 to a tenth memory 840.

The image processing device 100E illustrated in FIG. 8 may be understood as an example of the image processing device 100 of FIG. 1. Therefore, the same or substantially the same elements have been represented by the same reference numerals, and redundant description will be omitted.

In some implementations, the image processing device 100E may include a first memory 831 to a tenth memory 840, each of which is connected to a control logic circuit 120. Each of the first memory 831 to the tenth memory 840 may store a look-up table including data required for a processor to correct input color values.

In some implementations, the first memory 831, the second memory 832, the third memory 833, and the fourth memory 834 may store look-up tables including a plurality of pieces of data required for the first processor 111, the second processor 112, the third processor 113, or the fourth processor 114 to correct an input color value.

Each of the first memory 831, the second memory 832, the third memory 833, and the fourth memory 834 may store a look-up table having memory bits (for example, 2560 bits) corresponding to ¼ of memory bits (for example, 10240 bits) required for the processors 111, 112, 113, 114 to correct input color values.

The fifth memory 835 may store a fifth look-up table including data obtained by performing an exclusive OR operation on the data in the first look-up table stored in the first memory 831 and the data in the second look-up table stored in the second memory 832.

The sixth memory 836 may store a sixth look-up table including data, obtained by performing an exclusive OR operation on the data in the second look-up table stored in the second memory 832 and the data in the third look-up table stored in the third memory 833.

The seventh memory 837 may store a seventh look-up table including data obtained by performing an exclusive OR operation on the data in the third look-up table stored in the third memory 833 and the data of the fourth look-up table stored in the fourth memory 834.

The eighth memory 838 may store an eighth look-up table including data obtained by performing an exclusive OR operation on the data in the first look-up table stored in the first memory 831 and the data in the third look-up table stored in the third memory 833.

The ninth memory 839 may store a ninth look-up table including data obtained by performing an exclusive OR operation on the data in the second look-up table stored in the second memory 832 and the data of the fourth look-up table stored in the fourth memory 834.

The tenth memory 840 may store a tenth look-up table including data obtained by performing an exclusive OR operation on the data in the first look-up table stored in the first memory 831 and the data of the fourth look-up table stored in the fourth memory 834.

In some implementations, the control logic circuit 120 may transmit the data in the first look-up table, stored in the first memory 831, to the first processor 111 when receiving a read request for the first memory 831 from the first processor 111 to the fourth processor 114.

Also, the control logic circuit 120 may transmit data, obtained by performing an exclusive OR operation on the data in the second look-up table stored in the second memory 832 and the data of the fifth look-up table stored in the fifth memory 835, to the second processor 112.

Also, the control logic circuit 120 may transmit data, obtained by performing an exclusive OR operation on the data in the third look-up table stored in the third memory 833 and the data of the eighth look-up table stored in the eighth memory 838, to the third processor 113.

Also, the control logic circuit 120 may transmit data, obtained by performing an exclusive OR operation on the data of the fourth look-up table stored in the fourth memory 834 and the data of the tenth look-up table stored in the tenth memory 840, to the fourth processor 114.

In some implementations, the control logic circuit 120 may transmit the data in the first look-up table, stored in the first memory 831, to the first processor 111 when receiving a read request for the first memory 831 from the first processor 111 and the second processor 112 and receiving a read request for the third memory 833 from the third processor 113 and the fourth processor 114.

Also, the control logic circuit 120 may transmit data, obtained by performing an exclusive OR operation on the data in the second look-up table stored in the second memory 832 and the data of the fifth look-up table stored in the fifth memory 835, to the second processor 112.

Also, the control logic circuit 120 may transmit the data in the third look-up table, stored in the third memory 833, to the third processor 113.

Also, the control logic circuit 120 may transmit data, obtained by performing an exclusive OR operation on the data of the fourth look-up table stored in the fourth memory 834 and the data of the seventh look-up table stored in the seventh memory 837, to the fourth processor 114.

In some implementations, the control logic circuit 120 may transmit data of a look-up table, stored in a memory for which a read request is received, to each processor when receiving a read request for different memories from each of the first processor 111, the second processor 112, the third processor 113, and the fourth processor 114.

Referring to the above-described configurations, the image processing device 100E may control at least a portion of a plurality of processors to use a look-up table including data with an exclusive OR operation applied. Thus, the image processing device 100E may allow the plurality of processors to simultaneously access the same data.

Through the above-described configurations, the image processing device 100E may correct input color values using a look-up table having a relatively small number of memory bits, compared to the case in which a look-up table and a memory including the same data are assigned to each of the plurality of processors.

As a result, the image processing device 100E may reduce sizes of the first memory 831 to the sixth memory 836 in which a look-up table is stored. In addition, the image processing device 100E may reduce power, consumed by the plurality of processors, to correct color values using the look-up table.

FIG. 9 is a graph illustrating an example of a configuration in which performance of color correction for color values is improved as an image processing device utilizes a look-up table with an exclusive OR operation applied.

Referring to FIG. 9, an image processing device 100 may improve performance of correcting input color values using a look-up table including data with an exclusive OR operation applied.

Referring to FIGS. 1 to 9, the image processing device 100 may control at least a portion of a plurality of processors to use a look-up table including data with an exclusive OR operation applied. Thus, the image processing device 100 may allow the plurality of processors to simultaneously utilize the same data.

As a result, the image processing device 100 may correct an input color value using a lookup table having a relatively small number of memory bits in the case of using a lookup table with an exclusive OR operation applied (901), compared to the case in which a look-up table and a memory including the same data are applied to each of a plurality of processors (902).

Also, the image processing device 100 may increase the number of pieces of data used by each processor to correct am input color value.

For example, the image processing device 100 may assign additional mapping data to memory bits reduced in the case of using a look-up table with an exclusive OR operation applied (902), compared to the case in which a look-up table and a memory including the same data are assigned to each of a plurality of processors (901).

Accordingly, the image processing device 100 may increase image quality variables (for example, brightness and color gamut) corresponding to each input color value in the case of using a look-up table with an exclusive OR operation applied (902), compared to the case in which a look-up table and a memory including the same data are assigned to each of a plurality of processors (901).

Referring to FIG. 9, image quality variables (for example, brightness and color gamut) corresponding to samples having the same number of color values may increase in the case of using a look-up table with an exclusive OR operation applied (901), compared to the case in which a look-up table and a memory including the same data are assigned to each of a plurality of processors (902).

Referring to the above-described configurations, the image processing device 100 may improve performance of an operation of correcting the color value by utilizing the memory bits saved in the case of using a look-up table with an exclusive OR operation applied (901), compared to the case where a look-up table and memory including the same data are assigned to each of a plurality of processors (902).

As a result, the image processing device 100 may correct an input color value to improve the quality of an image including output color values (for example, image quality).

FIG. 10 is a graph illustrating an example of a configuration in which input color values are corrected to different image qualities as an image processing device utilizes a look-up table with an exclusive OR operation applied.

Referring to FIG. 10, the image processing device 100 may correct input color values into color values in different formats using different look-up tables.

For example, referring to FIG. 10, the image processing device 100 may include different look-up tables including different image quality variables (brightness and color gamut) corresponding to samples of input color values.

Referring to FIGS. 1 to 8 and FIG. 10, the image processing device 100 may control a processor to use different look-up tables including data with an exclusive OR (XOR) operation applied.

In some implementations, the image processing device 100 may correct an input color value using a look-up table having a relatively small number of memory bits in the case of using a look-up table with an exclusive OR operation applied, compared to the case in which a lookup table and a memory including the same data are assigned to each of a plurality of processors.

In this case, the image processing device 100 may store additional look-up tables using memory bits reduced in the case of using a look-up table with an exclusive OR operation applied, compared to the case in which the look-up table and the memory including the same data are assigned to each of the plural processors.

For example, the image processing device 100 may have additional look-up tables using memory bits reduced as each processor utilize a look-up table with an exclusive OR operation applied.

Referring to graph 1001 of FIG. 10, the image processing device 100 may convert input color values using a look-up table with an exclusive OR operation applied. This may allow the image processing device 100 to output an image having first quality.

Referring to graph 1002 of FIG. 10, the image processing device 100 may convert input color values using an additional look-up table utilizing memory bits reduced by utilizing a look-up table with an exclusive OR operation applied. This may allow the image processing device to output an image having second quality, different from the first quality.

In addition, this may allow the image processing device to expand a range of the quality of an image input by correcting the input color values.

As described above, the image processing device 100 may control at least a portion of a plurality of processors to use a look-up table including data with an exclusive OR operation applied. Thus, the image processing device may control the plurality of processors to simultaneously correct the input color values using the same data.

Through the above-mentioned configurations, the image processing device 100 may correct the input color value using a look-up table having a relatively small number of memory bits, compared to the case in which a look-up table and a memory including the same data are assigned to each of the plurality of processors.

As a result, the image processing system 10 may reduce sizes of the first memory 131, the second memory 132, and the third memory 133 in which look-up tables are stored.

In addition, the image processing system 10 may reduce the power, consumed by the plurality of processors to correct color values, using the look-up table.

As set forth above, an image processing device according to example implementations may correct input color values using a look-up table including data with an XOR operation applied.

As a result, the image processing device according to example implementations may reduce a size of a memory, in which a look-up table is stored, and consumption of power required to correct color values.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While example implementations have been shown and described above, it will be apparent to those skilled in the art that modifications and variations could be made without departing from the scope of the present concept as defined by the appended claims.

What is claimed is:

1. An image processing device comprising:

a first memory comprising a first look-up table, a second memory comprising a second look-up table, and a third memory comprising a third look-up table, the third look-up table including data obtained based on performing an exclusive OR (XOR) operation on a piece of data in the first look-up table and a piece of data in the second look-up table;

a first processor and a second processor, the first processor and the second processor configured to output a plurality of predetermined color values based on a plurality of input color values using at least one of the first look-up table, the second look-up table, and the third look-up table; and a control logic circuit configured to control at least a portion of the first memory, the second memory, and the third memory, wherein based on receiving a read request for the first memory from each processor of the first processor and the second processor, the control logic circuit is configured to:

transmit data in the first look-up table to the first processor; and transmit, to the second processor, data that is obtained based on performing an XOR operation on data in the third look-up table and data in the second look-up table.

2. The image processing device of claim 1, comprising:

a data decoding circuit connected to the control logic circuit and configured to output data from at least a portion of the first memory, the second memory, and the third memory, wherein the data decoding circuit comprises:

a first switching circuit connected to the first memory and the second memory;

a second switching circuit connected to the first memory and the second memory; and a third switching circuit connected to the first memory and the second memory through the second switching circuit, the third switching circuit connected to the third memory through a logic operation circuit, wherein the logic operation circuit is configured to perform an XOR operation, and wherein the control logic circuit is configured to control a plurality of switching circuits included in the data decoding circuit based on a request received from at least one of the first processor or the second processor.

3. The image processing device of claim 2, wherein based on receiving a read request for the first look-up table from each processor of the first processor and the second processor, the control logic circuit is configured to:

transmit the data in the first look-up table, through the first switching circuit, to the first processor;

transmit the data in the second look-up table, through the second switching circuit, to the third switching circuit; and transmit, through the third switching circuit to the second processor, the data that is obtained based on performing the XOR operation on the data in the second look-up table and the data in the third look-up table.

4. The image processing device of claim 2, wherein based on receiving a read request for the first memory from the first processor and receiving a read request for the second memory from the second processor, the control logic circuit is configured to:

control the first switching circuit to transmit the data in the first look-up table to the first processor; and control the second switching circuit and the third switching circuit to transmit the data in the second look-up table to the second processor.

5. The image processing device of claim 1, wherein the first processor comprises a first address generator and a first calculator, the first address generator is configured to generate a read request comprising address information, and transmit the generated read request to the control logic circuit, and the first calculator is configured to output the plurality of predetermined color values from the plurality of input color values using the data transmitted from the control logic circuit.

6. The image processing device of claim 5, wherein the control logic circuit is configured to transmit data, stored in a look-up table specified by the address information, to the first processor.

7. The image processing device of claim 2, comprising:

a data encoding circuit connected to the control logic circuit and configured to store data in at least a portion of the first memory, the second memory, and the third memory, wherein the data encoding circuit comprises:

a data assigner circuit configured to assign data to the first memory or the second memory based on a write request; and a direct memory access (DMA) circuit configured to perform an XOR operation on data stored in the first memory and data stored in the second memory, and store a result of the XOR operation in the third memory.

8. The image processing device of claim 1, comprising:

a nonvolatile memory configured to store data associated with the plurality of predetermined color values based on the plurality of input color values; and a write processor connected to the nonvolatile memory and the control logic circuit, wherein based on receiving a write request from the write processor, the control logic circuit is configured to store, in at least a portion of the first memory, the second memory, and the third memory, data that is stored in the nonvolatile memory.

9. The image processing device of claim 1, comprising:

a third processor configured to output the plurality of predetermined color values based on the plurality of input color values;

a fourth memory comprising a fourth look-up table;

a fifth memory comprising a fifth look-up table, the fifth look-up table including data obtained based on performing an XOR operation on the data in the second look-up table and data in the fourth look-up table; and a sixth memory comprising a sixth look-up table, the sixth look-up table including data obtained based on performing an XOR operation on the data in the first look-up table and the data in the fourth look-up table.

10. The image processing device of claim 9, wherein based on receiving a read request for the first memory from each processor of the first processor, the second processor, and the third processor, the control logic circuit is configured to:

transmit the data in the first look-up table to the first processor;

transmit, to the second processor, the data that is obtained based on performing the XOR operation on the data in the second look-up table and the data in the third look-up table; and transmit, to the third processor, data that is obtained based on performing an XOR operation on the data in the fourth look-up table and the data in the sixth look-up table.

11. An image processing device comprising:

a memory device comprising a first look-up table, a second look-up table, and a third look-up table, the third look-up table including a plurality of pieces of data obtained based on performing an exclusive OR (XOR) operation on a plurality of pieces of data in the first look-up table and a plurality of pieces of data in the second look-up table;

a first processor and a second processor, the first processor and the second processor configured to output a plurality of predetermined color values based on a plurality of input color values using at least a portion of the first look-up table, the second look-up table, and the third look-up table; and a control logic circuit configured to control the memory device, wherein based on receiving a read request for the first look-up table from each processor of the first processor and the second processor, the control logic circuit is configured to:

transmit data stored in the first look-up table to the first processor; and transmit, to the second processor, data that is obtained based on performing an XOR operation on data stored in the third look-up table and data stored in the second look-up table.

12. The image processing device of claim 11, wherein based on receiving a read request for the second look-up table from each processor of the first processor and the second processor, the control logic circuit is configured to:

transmit the data stored in the second look-up table to the first processor; and transmit, to the second processor, the data that is obtained based on performing an XOR operation on the data stored in the third look-up table and the data stored in the first look-up table.

13. The image processing device of claim 12, wherein based on receiving a read request for the first look-up table from the first processor and receiving a read request for the second look-up table from the second processor, the control logic circuit is configured to:

transmit the data stored in the first look-up table to the first processor; and transmit the data stored in the second look-up table to the second processor.

14. The image processing device of claim 11, wherein the first processor comprises a first address generator and a first calculator, the first address generator is configured to generate a read request comprising address information, and transmit the generated read request to the control logic circuit, and the first calculator is configured to output the plurality of predetermined color values from the plurality of input color values using the data transmitted from the control logic circuit.

15. The image processing device of claim 14, wherein the control logic circuit is configured to transmit data, stored in a look-up table at an address specified by the address information, to the first processor.

16. The image processing device of claim 11, wherein a data encoding circuit is connected to the control logic circuit, the data encoding circuit comprising a plurality of switching circuits, and the control logic circuit is configured to control the plurality of switching circuits in the data encoding circuit, and store data in at least a portion of the first look-up table, the second look-up table, and the third look-up table.

17. The image processing device of claim 11, comprising:

a nonvolatile memory configured to store data associated with the plurality of predetermined color values based on the plurality of input color values; and a write processor connected to the nonvolatile memory and the memory device, wherein based on receiving a write request from the write processor, the control logic circuit is configured to store, in at least a portion of the first look-up table, the second look-up table, and the third look-up table, data that is stored in the nonvolatile memory.

18. An image processing system comprising:

a display panel;

a first memory comprising a first look-up table, a second memory comprising a second look-up table, and a third memory comprising a third look-up table;

a first processor and a second processor, the first processor and the second processor configured to convert a plurality of input color values into a plurality of predetermined color values using at least one of the first look-up table, the second look-up table, or the third look-up table; and a control logic circuit configured to control at least a portion of the first memory, the second memory, and the third memory, wherein the third look-up table includes data obtained based on performing an exclusive OR (XOR) operation on a plurality of pieces of data in the first look-up table and a plurality of pieces of data in the second look-up table, based on receiving a read request for the first memory from each processor of the first processor and the second processor, the control logic circuit is configured to:

transmit data stored in the first look-up table to the first processor; and transmit, to the second processor, data that is obtained based on performing an XOR operation on data stored in the third look-up table and data stored in the second look-up table, and the first processor and the second processor are configured to output the plurality of predetermined color values through different regions in the display panel.

19. The image processing system of claim 18, wherein the first processor and the second processor are configured to generate the plurality of predetermined color values using the plurality of input color values and data obtained through the control logic circuit, the plurality of predetermined color values having a plurality of color gamuts and a plurality of gamma characteristics.

20. The image processing system of claim 19, wherein the first processor is configured to generate a color value for a first portion in the display panel, and the second processor is configured to generate a color value for a second portion, other than the first portion, in the display panel.

* * * * *